United States Patent
Ding et al.

(10) Patent No.: US 8,791,761 B2
(45) Date of Patent: Jul. 29, 2014

(54) ELECTRONIC SYSTEM, RF POWER AMPLIFIER AND OUTPUT POWER COMPENSATION METHOD THEREOF

(71) Applicants: Universal Scientific Industrial (Shanghai) Co., Ltd., Shanghai (CN); Universal Global Scientific Industrial Co., Ltd., Nantou County (TW)

(72) Inventors: Jaw-Ming Ding, Taoyuan County (TW); Wei-Hsuan Lee, New Taipei (TW)

(73) Assignees: Universal Scientific Industrial (Shanghai) Co., Ltd., Shanghai (CN); Universal Global Scientific Industrial Co., Ltd., Nantou County (TW)

( * ) Notice: Subject to any disclaimer, the term of this patent is extended or adjusted under 35 U.S.C. 154(b) by 83 days.

(21) Appl. No.: 13/750,164

(22) Filed: Jan. 25, 2013

(65) Prior Publication Data

US 2014/0159819 A1    Jun. 12, 2014

(30) Foreign Application Priority Data

Dec. 10, 2012  (TW) .............................. 101146362 A

(51) Int. Cl.
*H03F 3/04* (2006.01)
*H03F 3/21* (2006.01)
*H03F 3/19* (2006.01)

(52) U.S. Cl.
CPC ... *H03F 3/19* (2013.01); *H03F 3/21* (2013.01)
USPC .......................................... 330/296; 330/288

(58) Field of Classification Search
USPC ........................... 330/296, 285, 288; 323/316
See application file for complete search history.

(56) References Cited

U.S. PATENT DOCUMENTS 6,359,516 B1 * 3/2002 Luo et al. ...................... 330/296

* cited by examiner

*Primary Examiner* — Hieu Nguyen
(74) *Attorney, Agent, or Firm* — Li & Cai Intellectual Property (USA) Office

(57) ABSTRACT

A radio frequency (RF) power amplifier is disclosed. The power amplifier includes an output stage circuit, an exponential type bias circuit and a voltage-current transformation circuit. The output stage circuit receives a first system voltage and outputs an output current. The exponential type bias circuit receives a bias current, wherein a relationship between the bias current and output current is exponential, and when the bias current is zero current, and the output current is zero current. The voltage-current transformation circuit transforms the first system voltage into a second current so that the bias current is in proportion to the first system voltage, and thus the relationship between the output current and the first system voltage is exponential. The bias current is equal to times of the sum of the first current and the second current.

20 Claims, 5 Drawing Sheets

ELECTRONIC SYSTEM, RF POWER AMPLIFIER AND OUTPUT POWER COMPENSATION METHOD THEREOF

BACKGROUND OF THE DISCLOSURE

1. Field of the Disclosure

The instant disclosure relates to a radio frequency (RF) power amplifier; in particular, to a RF power amplifier which compensates an output power with an output current.

2. Description of Related Art

The latest concept in mobile phone designing not only focuses on a power added efficiency (PAE) along with the most output power, but also emphasizes on a high PAE in whether a high, medium, or low output power modes to offer a longer talking duration. After appropriately adjusting a gain of an output power of a power amplifier (PA), an output power ability, and linearity of a previous-stage power amplifier (PA), it is not only able to reduce an average current consumption, but also able to extend a talking duration. In prior arts, after a DC-to-DC converter is adopted with the PA, it is not only resulted in a lower power consumption at high output power, but also a low power consumption in the middle or low output power mode, and the PAE of the overall output power is increased.

A traditional switch mode power amplifier applied into 3G/4G wireless system may have provided an effective usage; however, given a demand of longer talking duration coming from consumers, and an objective to achieve the higher efficiency and lower power consumption in the middle/low output power mode, there is still improvement to be made.

SUMMARY OF THE DISCLOSURE

The instant disclosure provides a radio frequency (RF) power amplifier, and the power amplifier includes an output stage circuit, an exponential type bias circuit, and a voltage-current transformation circuit. The output stage circuit receives a first system voltage and outputs an output current. The exponential type bias circuit is coupled to the output stage circuit, and the exponential type bias circuit receives a bias current through being coupled to a second system voltage, wherein a relationship between the bias current and output current is exponential, and when the bias current is a zero current, the output current will be a zero current. The voltage-current transformation circuit is coupled to the exponential type bias circuit to receive a first current, and the voltage-current transformation circuit transforms the first system voltage received into a second current so that the relationship between the output current and the first system voltage is exponential. The bias current is equal to times of the sum of the first current and the second current.

In an embodiment of the instant disclosure, the voltage-current transformation circuit transmits a third current with a positive temperature coefficient to the exponential type bias circuit according to the first current with a positive temperature coefficient and the second current with a negative temperature coefficient, and thereby the bias current and the output current are currents with an equal to or close to zero temperature coefficient.

In an embodiment of the instant disclosure, the second current mirror consists of the fifth transistor and the sixth transistor, and there is an exponential relationship between the output current and a first system voltage, when the first system voltage increases progressively, the output current increases exponentially, and an output power of the output transistor is compensated thereby.

To sum up, the electronic system, the RF power amplifier, and the output power compensation method of the instant disclosure, through the exponential relationship between the output current and the first system voltage, compensate the dynamic range of the output power due to a characteristic of the output current increasing exponentially when the first system voltage is within a specific variation range. In addition, the RF power amplifier reaches a higher PAE and lower power consumption in a low output power mode, and thus achieves the demand for the longer talking duration from the consumers. Furthermore, the instant disclosure further achieves an effect of reducing the output current or the output power floating with the temperature, and stabilizes the output current or the output power of the RF power amplifier.

For further understanding of the instant disclosure, reference is made to the following detailed description illustrating the embodiments and examples of the instant disclosure. The description is only for illustrating the present disclosure, not for limiting the scope of the claim.

DETAILED DESCRIPTION OF PREFERRED EMBODIMENTS

[Embodiment of a RF Amplifier]

Figure 1:
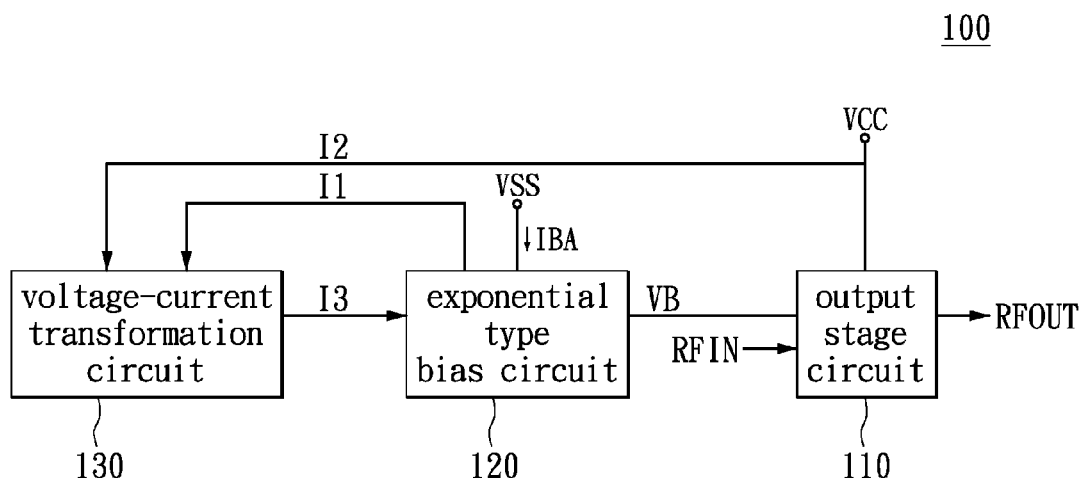
FIG. 1 shows a circuit block diagram of a RF power amplifier according to an embodiment of the instant disclosure.

Referring to FIG. 1, FIG. 1 shows a circuit block diagram of a RF power amplifier 100 according to an embodiment of the instant disclosure. The power amplifier 100 includes an output stage circuit 110, an exponential type bias circuit 120, and a voltage-current transformation circuit 130. The output stage circuit 110 is coupled to the exponential type bias circuit 120. The exponential type bias circuit 120 is coupled between the output stage circuit 110 and the voltage-current transformation circuit 130. The voltage-current transformation circuit 130 is coupled to the output stage circuit 110 and receives a first system voltage VCC.

In the present embodiment, the output stage circuit 110 receives the first system voltage VCC and outputs an output current. The exponential type bias circuit 120 through being coupled to a second system voltage VSS to receive a bias current IBA and the exponential type bias circuit 120 provides a bias voltage VB to the output stage circuit 110, wherein when the bias current IBA is a zero current, the output current will also be a zero current. The voltage-current transformation circuit 130 receives a first current I1, wherein the first current I1 feedbacks from the exponential type bias circuit 120 to the voltage-current transformation circuit 130. The voltage-current transformation circuit 130 transforms the first system voltage VCC received into a second current I2 so that the bias current IBA is in proportion to the first system voltage VCC, and a dynamic range of the output power is further compensated due to an exponential relationship between the output current and the first system voltage VCC. The bias current IBA is equal to times of a sum of the first current I1 and the second current I2, and a designer is able to further design according to an actual application demand.

In addition, the first current I1 is with a positive temperature coefficient and the second current I2 is with a negative temperature coefficient, and the voltage-current transformation circuit 130 transmits a third current I3 with the positive temperature coefficient to the exponential type bias circuit 120 according to the first current I1 and the second current I2, and whereby the bias current IBA and the output current are currents with an equal to or close to zero temperature coefficient.

There is further instruction in teaching an operation mechanism of the RF power amplifier 100 as recited below.

Before further instruction, it is to be clarified that in the instant disclosure, the positive temperature coefficient indicates that there is a proportional relationship between physical quantities (such as a voltage value, a current value, and a resistor value) and the temperature; which means, when the temperature increases or decreases, the physical quantities increases or decreases with the temperature; the negative temperature coefficient indicates that there is an inverse relationship between the physical quantities and the temperature; which means, when the temperature increases or decreases, the physical quantities decreases or increases with the temperature. The zero temperature coefficient in the instant disclosure indicates that the relationship between the physical quantities (such as the voltage value, the current value, and the resistor value) and the temperature is irrelevant, which means, when the temperature increases or decreases, the physical quantities do not increase or decrease with the temperature.

Referring to FIG. 1, in the present embodiment, the RF power amplifier 100 provides the first system voltage VCC with a DC-to-DC converter (not shown in FIG. 1) which is relatively stable with a temperature variation so as to maintain the output power of the RF power amplifier 100 within a range with the high efficiency and low power consumption consistently. According to Equation (1), it is assumed that if the first system voltage VCC is operated between 0.5V-3.5V, the dynamic range of the output power of the first system voltage VCC is about 8 dB. Among which, symbol P represents the output power, and symbol I represents the output current, and symbol V represents the first system voltage. Considering that the standard of the RF power amplifier applied into the 3G/4G wireless communication system is that the output power of the RF power amplifier 100 demanded to be with the dynamic range of 30 dB, simply through the first system voltage VCC providing the dynamic range of the output power about 30 Db is not practical and fails to meet a requirement of the operating range of the system voltage currently.

$$P = I \times V \quad (1)$$

Therefore, in the instant disclosure, another part of the dynamic range of the output power required is provided with an adjustable output current. In the present embodiment, the first system voltage VCC feedbacks to the voltage-current transformation circuit 130 so that there is an exponential relationship between the output current and the first system voltage VCC, and the first system voltage VCC is further maintained within a reasonable operating range, and when the first system voltage VCC increases, the RF power amplifier 100 is able to have the output current shown a characteristic of increasing exponentially so as to provide a contribution to the dynamic range. Among which, the exponential type bias circuit 120 is coupled to the second system voltage VSS to receive the bias current IBA, and the exponential type bias circuit 120 provides the bias voltage VB to the output stage circuit 110, and there is an exponential relationship between the bias current IBA and the output current of the output stage circuit 110 accordingly. It is worth mentioning that when the bias current IBA is a zero current, the output current of the RF power amplifier 100 will also be a zero current so as to reduce the power consumption of the RF power amplifier 100.

In the following embodiments, only parts that are different from parts of the embodiment in the FIG. 1 described, and the identical parts are omitted. In addition, for an easy instruction, similar referred numbers or symbols indicates elements alike.

[Embodiment of a RF Amplifier]

Figure 2:
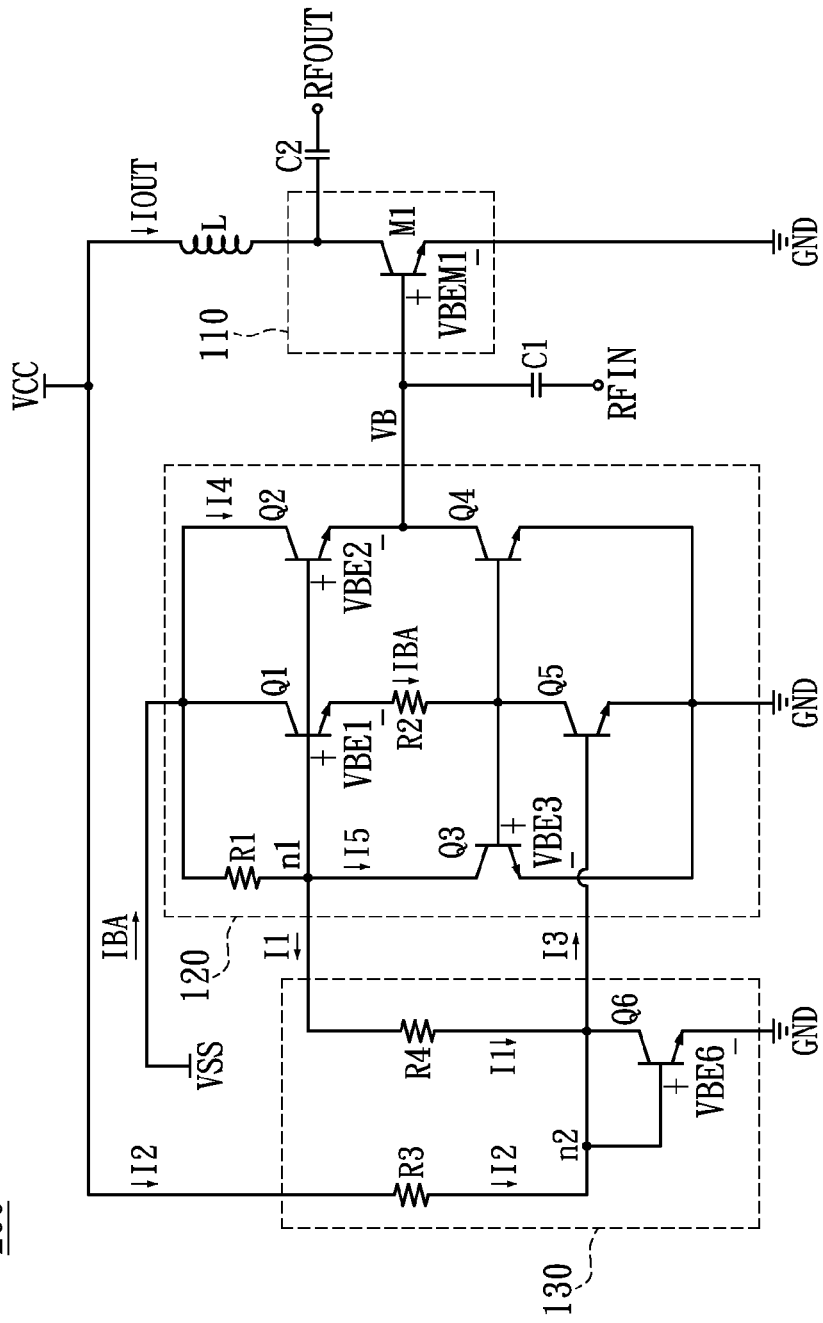
FIG. 2 shows a detailed circuit diagram of a RF power amplifier according to an embodiment of the instant disclosure.

Referring to FIG. 2, FIG. 2 shows a detailed circuit diagram of a RF power amplifier 200 according to an embodiment of the instant disclosure. Different from the embodiment in FIG. 1, in the present embodiment. An output stage circuit 110 includes an output transistor M1. An exponential type bias circuit 120 includes a first resistor R1, a first transistor Q1, a second transistor Q2, a second resistor R2, a third transistor Q3, a fourth transistor Q4, and a fifth transistor Q5. A voltage-current transformation circuit 130 includes a third resistor R3, a fourth resistor R4, and a sixth transistor Q6.

A collector and an emitter of the output transistor M1 receives a first system voltage VCC and a ground voltage GND respectively, and a base of the output transistor M1 receives a bias voltage VB provided by the exponential type bias circuit 120 to receive a bias input current (i.e. a base current). A terminal of the first resistor R1 is coupled to a second system voltage VSS. A collector and a base of the first transistor Q1 are respectively coupled to the second system voltage VSS and another terminal of the first resistor R1. A collector, a base, and an emitter of the second transistor Q2 are respectively coupled to the second system voltage VSS, the base of the first transistor Q1, and the base of the output transistor M1, wherein the collector of the second transistor Q2 receives a fourth current I4 and the emitter provides the bias voltage VB to the base of the output transistor M1. A terminal of the second resistor R2 is coupled to the emitter of the first transistor Q1, wherein a bias current IBA flows through the second resistor R2. A collector, a base, and an emitter of the third transistor Q3 are respectively coupled to another terminal of the first resistor R1, another terminal of the second resistor R2, and the ground voltage GND, wherein the collector of the third transistor Q3 receives a fifth current I5. A collector, a base, and an emitter of the fourth transistor Q4 are respectively coupled to the base of the output transistor M1, another terminal of the second resistor R2, and the ground voltage GND, wherein the first current mirror consists of the third transistor Q3 and the fourth transistor Q4. A collector of the fifth transistor Q5 is coupled to another terminal of the second resistor R2, and a base of the fifth transistor Q5 is coupled to the voltage-current transformation circuit 130 to receive the third current I3, wherein the third current I3 flows from a collector of the sixth transistor Q6 to the base of the fifth transistor Q5, and the third current I3 is a current with a positive temperature coefficient. A terminal of the third resistor R3 is coupled to the first system voltage VCC. A terminal of the fourth resistor R4 is coupled to another terminal of the first resistor R1, and another terminal of the fourth resistor R4 is coupled to another terminal of the third resistor R3. A base and the collector of the sixth transistor Q6 are coupled to another terminal of the third resistor R3, an emitter of the sixth transistor Q6 is coupled to the ground voltage GND, wherein the second current mirror consists of the sixth transistor Q6 and the fifth transistor Q5.

There is further instruction in teaching an operation mechanism of the RF power amplifier 200.

When the first system voltage VCC is within an operating range of 0.5V-3.5V, a dynamic range of output power provided to the RF power amplifier 200 is just about 8 dB; therefore, to stay in a reasonable operating range for the system voltage, the present embodiment of the instant disclosure provides another part of the dynamic range of the output power for the RF power amplifier 200 with an output current IOUT. In an embodiment, the standard of the RF power amplifier is that the output power of the RF power amplifier 200 demanded to have the dynamic range of 30 dB, and thus the output current IOUT has to provide 22 dB for the dynamic range of the output power.

In the present embodiment, the RF power amplifier 200 uses the exponential type bias circuit 120 to generate an exponential relationship between the bias current IBA and the output current IOUT, as shown in Equation (2), wherein symbol Vt represents a thermal voltage and symbol R4 represents a resistor value of the fourth resistor R4. Afterwards, the RF power amplifier 200 uses the voltage-current transformation circuit 130 to transform the bias current IBA into the first system voltage VCC, as shown in Equation (3), wherein R3 represents a resistor value of the third resistor R3. Equations (2) and (3) are resulted in Equation (4), and thus it is able to get an output current IOUT increasing exponentially through the first system voltage VCC increasing progressively within the operating range (i.e. 0.5V-3.5V).

$$IOUT = IBA \times e^{[(IBA \times R2)/Vt]} \tag{2}$$

$$IBA = VCC/R3 \tag{3}$$

$$IOUT = IBA \times e^{[R2 \times VCC/R3 \times Vt]} \tag{4}$$

To be more specific, through Kirchhoff's Voltage Law (KVL), it is known that a sum of a base-emitter voltage VBE1 of the first transistor Q1, a voltage drop of the second resistor R2, and a base-emitter voltage VBE3 of the third transistor Q3 is equal to a base-emitter voltage VBE2 of the second transistor Q2 and a base-emitter voltage VBEM1 of the output transistor M1, as shown in Equation (5). It is worth mentioning that the first current mirror consists of the third transistor Q3 and the fourth transistor Q4, and through a design of a manufacture process, it is possible to make the fourth current I4 to be equal to the fifth current I5, and Equation (5) is further resulted in Equation (2). In other words, the exponential type bias circuit 120 of the present embodiment is coupled to the second system voltage VSS to receive the bias current IBA, and also coupled to the base of the output transistor M1, and accordingly the relationship between the output current IOUT and the bias current IBA is exponential.

$$VBE1 + (IBA \times R2) + VBE3 = VBE2 + VBEM1 \tag{5}$$

Figure 3:
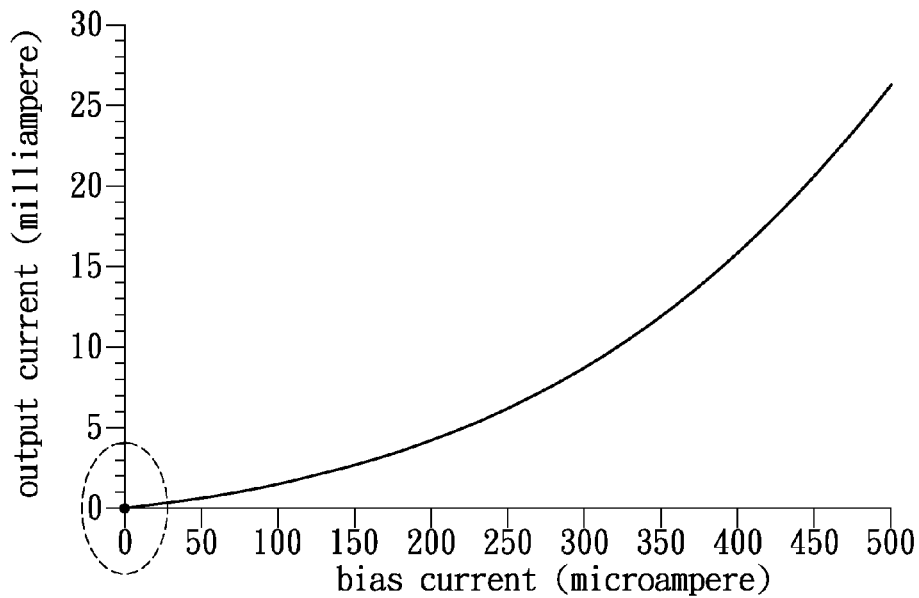
FIG. 3 shows a simulation waveform of a relationship between an output current and a bias current according to the embodiment of the instant disclosure.

Referring to FIG. 3, FIG. 3 shows a simulation waveform of a relationship between an output current and a bias current according to the embodiment of the instant disclosure. In the present embodiment, FIG. 3 is a waveform corresponds to Equation (2), a horizontal axis represents the bias current IBA, whose unit is microampere, and a vertical axis represents the output current IOUT, whose unit is milliampere. It is worth noticing that when the bias current IBA is a zero current, the RF power amplifier 200 is able to be switched off completely; which means, the output current IOUT of the RF power amplifier 200 will also be a zero current, and further reduces the power consumption and which is in accordance with the demand of a longer talking duration according to the consumers.

Afterwards, the RF power amplifier 200 of the present embodiment uses the third resistor R3, the fourth resistor R4, and the sixth transistor Q6 to switch a relationship between the voltage and the current; which means, the bias current IBA in Equation (2) is replaced with Equation (3). Furthermore, the third resistor R3 in the voltage-current transformation circuit 130 receives the second current I2 from the output stage circuit 110 through feedback, and the fourth resistor R4 receives the first current I1 from the exponential type bias circuit 120 through feedback, wherein the first current I1 is equal to a value of a voltage of a first node n1 minus a voltage of a second node n2 and then divided by a resistor value of the fourth resistor R4; in addition, the second current I2 is equal to a value of the first system voltage VCC minus a voltage of the second node n2, and the voltage of the first node n1 is a sum of a base-emitter voltage VBE2 of the second transistor Q2 and a base-emitter voltage VBEM1 of the output transistor M1; the voltage of the second node n2 is the base-emitter voltage VBE6 of the sixth transistor Q6. The first current I1 is shown as Equation (6), and the second current I2 is shown as Equation (7).

$$I1 = (VBE2 + VBEM1 - VBE6)/R4 \tag{6}$$

$$I2 = (VCC - VBE6)/R3 \tag{7}$$

Afterwards, the base-emitter voltage VBE2 of the second transistor Q2 is equal to the base-emitter voltage VBEM1 of the output transistor M1. According to Equations (6) and (7), the first current I1 is a current with a positive temperature coefficient, and the second current I2 is a current with a negative temperature coefficient, and a sum of the first current I1 and the second current I2 is a current with a positive temperature coefficient and compensates a base-emitter voltage of the sixth transistor Q6 with a negative temperature coefficient decreasing with an increasing temperature. In addition, the circuit topology configurations of the fifth transistor Q5 and the sixth transistor Q6 are current mirrors, and thus in the present embodiment, when an emitter area of the fifth transistor Q5 is N times of an emitter area of the sixth transistor Q6, the bias current IBA is N times of a sum of the first current I1 and the second current I2. In the present embodiment, the emitter areas of the fifth transistor Q5 and the sixth transistor are the same, and the bias current IBA is equal to the sum of the first current I1 and the second current I2, as shown in Equation (3), and thus the bias current IBA is able to be adjusted to be a current with a close to or equal to zero temperature coefficient through the resistor values of the third resistor R3 and the fourth resistor R4 so as to compensate a temperature coefficient of the bias current IBA. According to Equation (4), when the bias current IBA is a current with the close to or equal to zero temperature coefficient, the output current IOUT will also be a current with a close to or equal to zero temperature coefficient; therefore, the voltage-current transformation circuit 130 of the instant disclosure has an effect of temperature compensation.

In addition, in the present embodiment, the third current I3 is a current with a positive temperature coefficient, and since a current gain of the fifth transistor Q5 is with a negative temperature coefficient, a collector current of the fifth transistor is able to be further adjusted as a current with a close to or equal to zero temperature coefficient.

Figure 4:
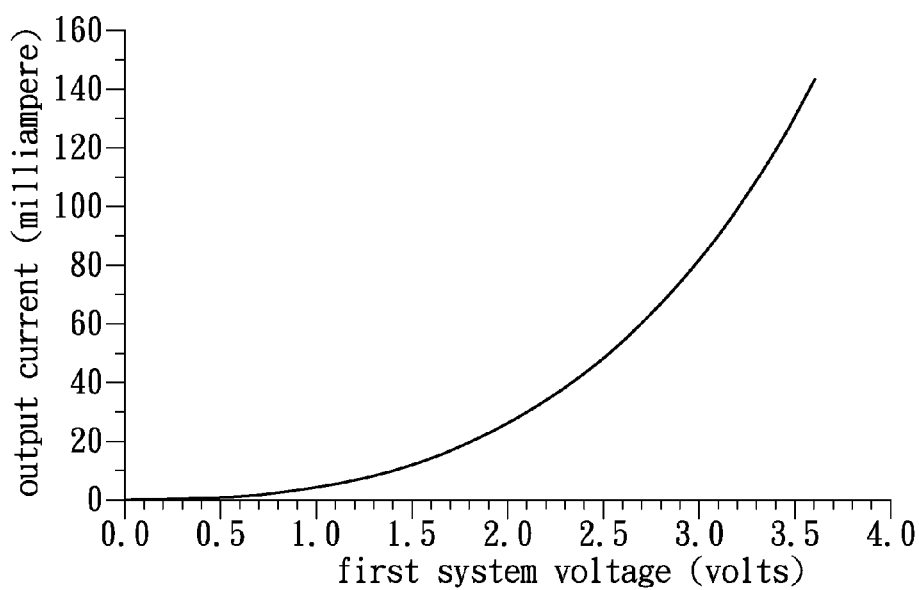
FIG. 4 shows a simulation waveform of a relationship between a first system voltage and an output current according to the embodiment of the instant disclosure.

Referring to FIG. 4, FIG. 4 shows a simulation waveform of a relationship between a first system voltage and an output current according to the embodiment of the instant disclosure. Furthermore, FIG. 4 shows waveform corresponds to Equation (4), a horizontal axis represents the system voltage VCC, whose unit is volt, and a vertical axis represents the output current IOUT, whose unit is milliampere. When the first system voltage VCC progressively increases within the operating range of 0.5V-3.5V, the output current IOUT shows a characteristic of exponential increase, and thus the output current IOUT in the present embodiment is able to provide a main contribution to the dynamic range of the output power for the RF power amplifier 200. In the present embodiment, the first system voltage VCC provides the dynamic range of 8 dB within the operating range of 0.5V-3.5V, and the output current IOUT provides the dynamic range of almost 22 dB, and thereby to compensate the output power of the RF power amplifier 200. In actual application, a designer may base on an actual application demand to adjust the resistor values of the second and third resistors R2 and R3 so as to adjust a volume of the output current IOUT, and further adjusts an overall dynamic range of the output power demanded for the RF power amplifier 200.

Figure 5:
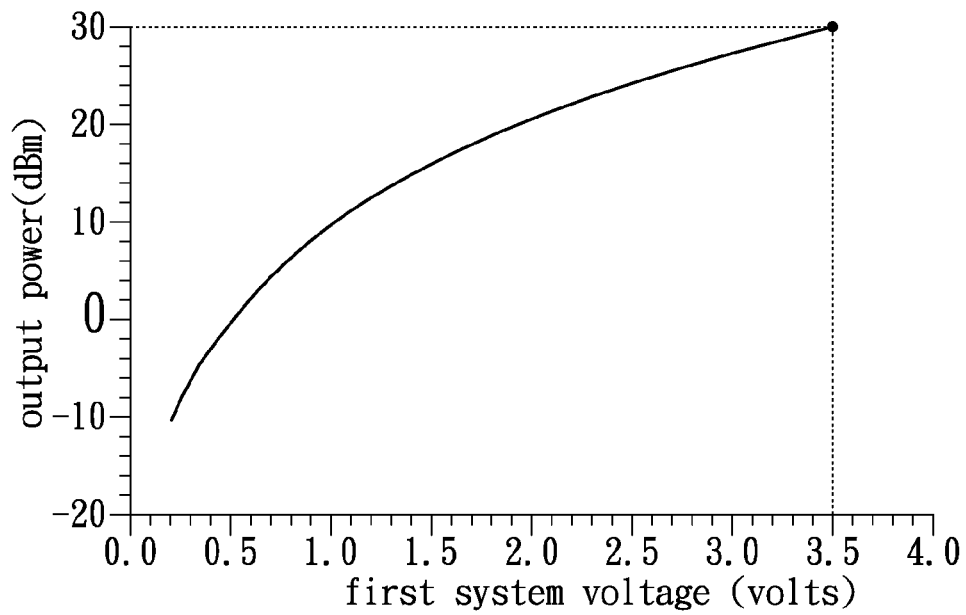
FIG. 5 shows a simulation waveform of a relationship between the first system voltage and an output power according to the embodiment of the instant disclosure.

Referring to FIG. 5, FIG. 5 shows a simulation waveform of a relationship between the first system voltage and an output power according to the embodiment of the instant disclosure. In FIG. 5, a horizontal axis represents the first system voltage, whose unit is volt; a vertical axis represents the output power, whose unit is dBm. According to FIG. 5, in the present embodiment, when the first system voltage VCC is within the operating range of 0.5V-3.5V, the highest dynamic range that the output power reaches is about 30 dB. Therefore, with the design of the bias circuit of the RF power amplifier 200 of the instant disclosure, a designer may have the RF power amplifier 200 reach a higher output power and power added efficiency (PAE) whether in conditions of low, middle, or high power efficiency, and thereby to correspond to the demand of a longer talking duration from the consumers.

In addition, the output stage circuit 110 further has a first inductor L, a first capacitor C1, and a second capacitor C2. A terminal of the first capacitor C1 is coupled to the base of the output transistor M1, and another terminal of the first capacitor C1 is coupled to a RF input signal RFIN. The first inductor L is coupled between the first system voltage VCC and the collector of the output transistor M1. A terminal of the second capacitor C2 is coupled to the collector of the output transistor M1, and another terminal of the second capacitor C2 outputs a RF output signal RFOUT.

When the RF power amplifier 200 has not started receiving the RF input signal RFIN yet, the first inductor L shows a low-impedance state, such as a short circuit, to a DC signal; on the other hand, the capacitors C1 and C2 show a high-impedance state, such as an open circuit, to the DC signal. When the RF power amplifier 200 starts receiving the RF input signal RFIN, the first inductor L1 shows the high-impedance status, such as the open circuit, to a high-frequency signal; on the other hand, the capacitors C1 and C2 show the low-impedance status, such as the short circuit, to the high-frequency signal. Accordingly, the RF power amplifier 200 is able to work well under DC or AC working modes.

[Embodiment of an Electronic System]

Figure 6:
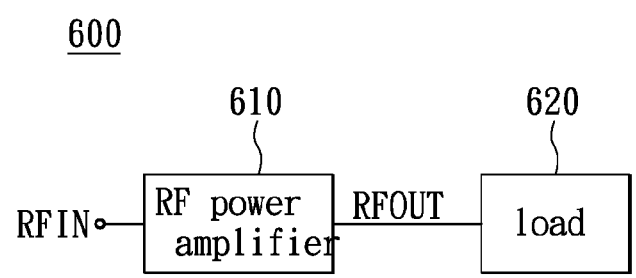
FIG. 6 shows a block diagram of an electronic system according to the embodiment of the instant disclosure.

Referring to FIG. 6, FIG. 6 shows a block diagram of an electronic system according to the embodiment of the instant disclosure. The electronic system 600 includes a RF power amplifier 610 and a load 620. The RF power amplifier 610 receives a RF input signal RFIN and outputs a RF output signal RFOUT to the load 620; which means, after the RF power amplifier 610 coupled to the first and the second system voltage, there is an output power stably provided to the load 620. The RF power amplifier 610 may be either of the RF power amplifiers 100 or 200 of the embodiments in FIGS. 1-2, providing an output power to the load 620 stably. The electronic system 600 may be a system in various kinds of electronic devices such as hand-held devices or portable devices.

[Embodiment of Output Power Compensation Method]

Figure 7:
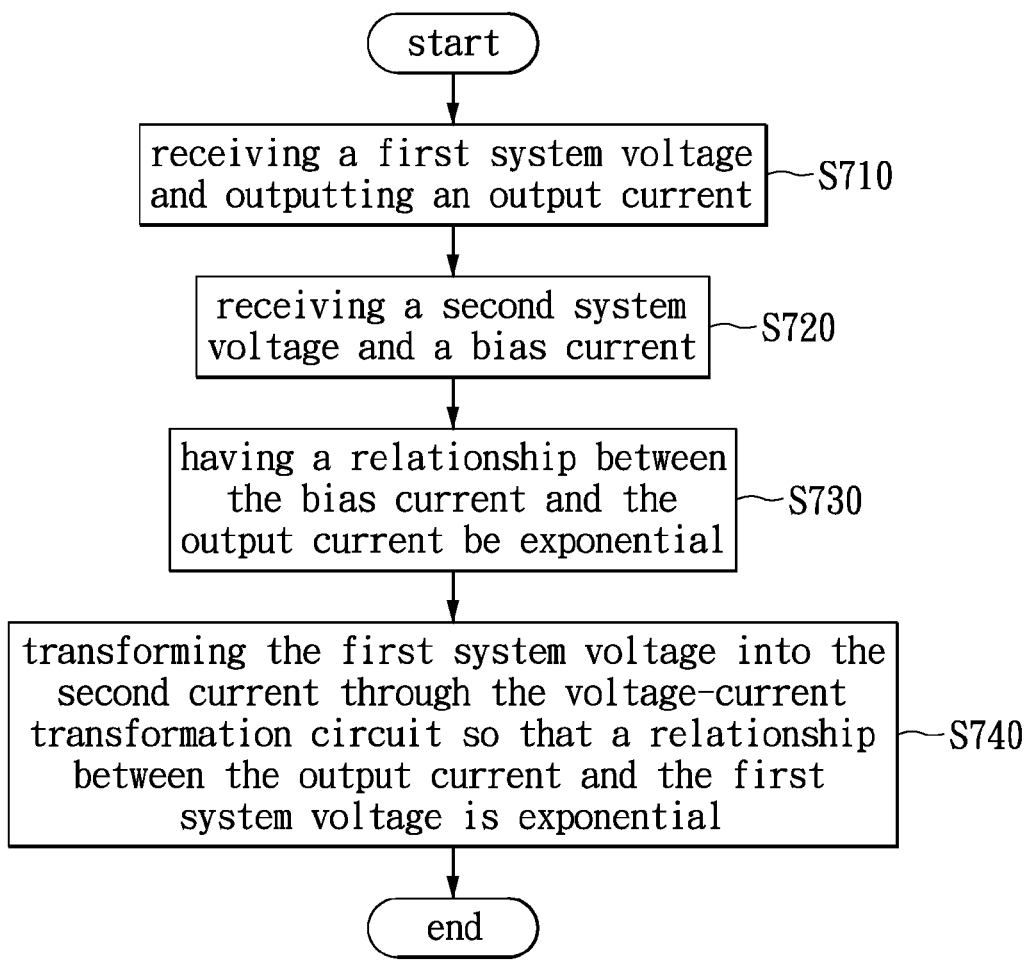
FIG. 7 shows a flow chart of an output power compensation method according to an embodiment of the instant disclosure.

Referring to FIG. 7, FIG. 7 shows a flow chart of an output power compensation method according to an embodiment of the instant disclosure. The method of the present embodiment may be conducted in the RF power amplifiers shown in FIGS. 1-2, and thus please refer to FIGS. 1-2 for further understanding. The output power compensation method for the RF power amplifier include steps as follows: receiving a first system voltage and outputting an output current (S710); receiving a second system voltage and a bias current (S720); having a relationship between the bias current and the output current be exponential through the exponential type bias circuit (S730); transforming the first system voltage into the second current through the voltage-current transformation circuit so that a relationship between the output current and the first system voltage is exponential (S740). It is to be clarified that the output power compensation method of the instant disclosure is applied into the RF power amplifiers of the embodiments in FIGS. 1-2, or the electronic system of the embodiment in FIG. 6.

Relevant details of the steps of the output power compensation method for the RF power amplifier have been described in the embodiments of FIGS. 1-5, and it is not repeated thereto. It is to be clarified that, a sequence of the steps in FIG. 7 is simply for an easy instruction, and thus the sequence of the steps is not used as a condition in demonstrating the embodiments of the instant disclosure.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A RF power amplifier, comprising:
an output stage circuit, receiving a first system voltage, and outputting an output current;
an exponential type bias circuit, coupled to the output stage circuit, receiving a bias current through being coupled to a second system voltage, wherein the relationship between the bias current and output current is exponential, and when the bias current is a zero current, the output current is a zero current; and
a voltage-current transformation circuit, coupled to the exponential type bias circuit to receive a first current, transforming a first system voltage received into a second current so that the bias current is in proportion to the first system voltage, and thus a relationship between the output current and the first system voltage is exponential,
wherein the bias current is equal to times of a sum of the first current and the second current.

2. The RF power amplifier according to claim 1, wherein the voltage-current transformation circuit transmits a third current with a positive temperature coefficient to the exponential type bias circuit according to the first current with a positive temperature coefficient and the second current with a negative temperature coefficient, and whereby the bias current and the output current are currents with an equal to or close to zero temperature coefficient.

3. The RF power amplifier according to claim 2, wherein the output stage circuit comprising:
an output transistor, having a collector coupled to the first system voltage, an emitter coupled to a ground voltage, and a base receiving a bias voltage provided from the exponential type bias circuit.

4. The RF power amplifier according to claim 3, wherein the exponential type bias circuit comprising:
a first resistor, having a terminal coupled to the second system voltage;
a first transistor, having a collector coupled to the second system voltage, and a base coupled to another terminal of the first resistor;
a second transistor, having a collector coupled to the second system voltage and receiving a fourth current, a base coupled to the base of the first transistor, and an emitter providing the bias voltage to the base of the output transistor;
a second resistor, having a terminal coupled to the emitter of the first transistor, wherein a bias current flows through the second resistor;
a third transistor, having a collector coupled to another terminal of the first resistor and receiving a fifth current, a base coupled to another terminal of the second resistor, and an emitter coupled to the ground voltage;
a fourth transistor, having a collector coupled to the base of the output transistor, a base coupled to another terminal of the second resistor, and an emitter coupled to the ground voltage, wherein a first current mirror consists of the third transistor and the fourth transistor; and
a fifth transistor, having a collector coupled to another terminal of the second resistor, and a base coupled to the voltage-current transformation circuit to receive the third current,
wherein when the fourth current is equal to the fifth current, a relationship between the bias current and the output current is exponential, and when the bias current increases progressively, the output current increases exponentially.

5. The RF power amplifier according to claim 4, wherein the voltage-current transformation circuit comprising:
a third resistor, having a terminal coupled to the first system voltage, and receiving the second current, wherein the third resistor transforms the first system voltage into the second current;
a fourth resistor, having a terminal coupled to another terminal of the first resistor to receive the first current, and another terminal coupled to another terminal of the third resistor; and
a sixth transistor, having a base and the collector coupled to another terminal of the third resistor, and an emitter coupled to the ground voltage,
wherein a second current mirror consists of the sixth transistor and the fifth transistor, and a relationship between the output current and the first system voltage is exponential, and when the first system voltage increases progressively, the output current increases exponentially, and an output power of the output transistor is compensated thereby.

6. The RF power amplifier according to claim 5, wherein the first current is equal to a value of a voltage of a first node minus a voltage of a second node and then divided by a resistor value of the fourth resistor; the second current is equal to a value of the first system voltage minus a voltage of the second node and then divided by a resistor value of the third resistor,
wherein the voltage of the first node is a sum of a base-emitter voltage of the second transistor and a base-emitter voltage of the output transistor, and the voltage of the second node is the base-emitter voltage of the sixth transistor.

7. An electronic system for RF communication, the electronic system comprising:
a RF power amplifier according to claim 1, the RF power amplifier receiving a RF input signal and outputting a RF output signal; and
a load, receiving the RF output signal.

8. The electronic system according to claim 7, wherein the voltage-current transformation circuit transmits a third current with a positive temperature coefficient to the exponential type bias circuit according to the first current with a positive temperature coefficient and the second current with a negative temperature coefficient, and whereby the bias current and the output current are currents with an equal to or close to zero temperature coefficient.

9. The electronic system according to claim 8, wherein the output stage circuit comprising:
an output transistor, having a collector coupled to the first system voltage, an emitter coupled to a ground voltage, and a base receiving a bias voltage provided from the exponential type bias circuit.

10. The electronic system according to claim 9, wherein the exponential type bias circuit comprising:
a first resistor, having a terminal coupled to the second system voltage;
a first transistor, having a collector coupled to the second system voltage, and a base coupled to another terminal of the first resistor;
a second transistor, having a collector coupled to the second system voltage and receiving a fourth current, a base coupled to the base of the first transistor, and an emitter providing the bias voltage to the base of the output transistor;
a second resistor, having a terminal coupled to the emitter of the first transistor, wherein a bias current flows through the second resistor;
a third transistor, having a collector coupled to another terminal of the first resistor and receiving a fifth current, a base coupled to another terminal of the second resistor, and an emitter coupled to the ground voltage;
a fourth transistor, having a collector coupled to the base of the output transistor, a base coupled to another terminal of the second resistor, and an emitter coupled to the ground voltage, wherein a first current mirror consists of the third transistor and the fourth transistor; and
a fifth transistor, having a collector coupled to another terminal of the second resistor, and a base coupled to the voltage-current transformation circuit to receive the third current,
wherein when the fourth current is equal to the fifth current, a relationship between the bias current and the output current is exponential, and when the bias current increases progressively, the output current increases exponentially.

11. The electronic system according to claim 10, wherein the voltage-current transformation circuit comprising:
a third resistor, having a terminal coupled to the first system voltage, and receiving the second current, wherein the third resistor transforms the first system voltage into the second current;

a fourth resistor, having a terminal coupled to another terminal of the first resistor to receive the first current, and another terminal coupled to another terminal of the third resistor; and a sixth transistor, having a base and the collector coupled to another terminal of the third resistor, and an emitter coupled to the ground voltage, wherein the third current flows from a collector of the sixth transistor to the base of the fifth transistor, wherein a second current mirror consists of the sixth transistor and the fifth transistor, and a relationship between the output current and the first system voltage is exponential, and when the first system voltage increases progressively, the output current increases exponentially, and an output power of the output transistor is compensated thereby.

12. The electronic system according to claim 11, wherein the first current is equal to a value of a voltage of a first node minus a voltage of a second node and then divided by a resistor value of the fourth resistor; the second current is equal to a value of the first system voltage minus a voltage of the second node and then divided by a resistor value of the third resistor, wherein the voltage of the first node is a sum of a base-emitter voltage of the second transistor and a base-emitter voltage of the output transistor, and the voltage of the second node is the base-emitter voltage of the sixth transistor.

13. An output power compensation method, comprising:
receiving a first system voltage and outputting an output current;
receiving a second system voltage and a bias current;
having a relationship between the bias current and the output current be exponential through an exponential type bias circuit; and
transforming the first system voltage into a second current through the voltage-current transformation circuit so that a relationship between the output current and the first system voltage is exponential,
wherein the output power compensation method is applied into the RF power amplifier according to claim 1 or the electronic system according to claim 7.

14. The output power compensation method according to claim 13, wherein when the bias current is a zero current, and the output current will be a zero current, and the bias current is in proportion to the first system voltage.

15. The output power compensation method according to claim 13, wherein the bias current is equal to times of the sum of the first current and the second current, and the bias current is in proportion to the first system voltage.

16. The output power compensation method according to claim 13, wherein the voltage-current transformation circuit transmits a third current with a positive temperature coefficient to the exponential type bias circuit according to the first current with a positive temperature coefficient and the second current with a negative temperature coefficient, and whereby the bias current and the output current are currents with an equal to or close to zero temperature coefficient.

17. The output power compensation method according to claim 16, wherein the output stage circuit comprising:
an output transistor, having a collector coupled to the first system voltage, an emitter coupled to a ground voltage, and a base receiving a bias voltage provided from the exponential type bias circuit.

18. The output power compensation method according to claim 17, wherein the exponential type bias circuit comprising:

a first resistor, having a terminal coupled to the second system voltage;
a first transistor, having a collector coupled to the second system voltage, and a base coupled to another terminal of the first resistor;
a second transistor, having a collector coupled to the second system voltage and receiving a fourth current, a base coupled to the base of the first transistor, and an emitter providing the bias voltage to the base of the output transistor;
a second resistor, having a terminal coupled to the emitter of the first transistor, wherein a bias current flows through the second resistor;
a third transistor, having a collector coupled to another terminal of the first resistor and receiving a fifth current, a base coupled to another terminal of the second resistor, and an emitter coupled to the ground voltage;
a fourth transistor, having a collector coupled to the base of the output transistor, a base coupled to another terminal of the second resistor, and an emitter coupled to the ground voltage, wherein a first current mirror consists of the third transistor and the fourth transistor; and
a fifth transistor, having a collector coupled to another terminal of the second resistor, and a base coupled to the voltage-current transformation circuit to receive the third current,
wherein when the fourth current is equal to the fifth current, a relationship between the bias current and the output current is exponential, and when the bias current increases progressively, the output current increases exponentially.

19. The output power compensation method according to claim 18, wherein the voltage-current transformation circuit comprising:
a third resistor, having a terminal coupled to the first system voltage, and receiving the second current, wherein the third resistor transforms the first system voltage into the second current;
a fourth resistor, having a terminal coupled to another terminal of the first resistor to receive the first current, and another terminal coupled to another terminal of the third resistor; and
a sixth transistor, having a base and the collector coupled to another terminal of the third resistor, and an emitter coupled to the ground voltage, wherein the third current flows from a collector of the sixth transistor to the base of the fifth transistor,
wherein a second current mirror consists of the sixth transistor and the fifth transistor, and a relationship between the output current and the first system voltage is exponential, and when the first system voltage increases progressively, the output current increases exponentially, and an output power of the output transistor is compensated thereby.

20. The output power compensation method according to claim 19, wherein the first current is equal to a value of a voltage of a first node minus a voltage of a second node and then divided by a resistor value of the fourth resistor; the second current is equal to a value of the first system voltage minus a voltage of the second node and then divided by a resistor value of the third resistor,
wherein the voltage of the first node is a sum of a base-emitter voltage of the second transistor and a base-emitter voltage of the output transistor, and the voltage of the second node is the base-emitter voltage of the sixth transistor.

* * * * *